(12) United States Patent
Chen

(10) Patent No.: US 7,265,804 B2
(45) Date of Patent: Sep. 4, 2007

(54) LIQUID CRYSTAL DISPLAY MODULE WITH A FILLED WIRING STRUCTURE HAVING SQUARE SHAPED PADS DISTRIBUTED LIKE A MATRIX

(75) Inventor: Hui-Chang Chen, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 33 days.

(21) Appl. No.: 10/849,828

(22) Filed: May 21, 2004

(65) Prior Publication Data

US 2005/0083473 A1    Apr. 21, 2005

(30) Foreign Application Priority Data

Oct. 16, 2003    (TW) ............................. 92128771 A

(51) Int. Cl.
  *G02F 1/1345*    (2006.01)
(52) U.S. Cl. ...................... 349/150; 349/149; 349/151; 349/152
(58) Field of Classification Search ................. 349/150
  See application file for complete search history.

(56) References Cited

U.S. PATENT DOCUMENTS 4,832,455 A * 5/1989 Takeno et al. .............. 349/149
5,406,028 A * 4/1995 Beng et al. ................. 174/52.2
5,608,559 A * 3/1997 Inada et al. ................. 349/149
6,061,246 A * 5/2000 Oh et al. ..................... 361/749
6,083,666 A   7/2000 Kim
6,278,509 B1 * 8/2001 Ohga et al. ................. 349/150
6,675,470 B2 * 1/2004 Muramatsu ................. 29/832
6,680,759 B2 * 1/2004 Ogawa ....................... 349/54
2003/0227592 A1 * 12/2003 Izumi et al. ................ 349/149

FOREIGN PATENT DOCUMENTS

TW    463070    11/2001
TW    531861    5/2003

* cited by examiner

Primary Examiner—Andrew Schechter
Assistant Examiner—Lucy Chien
(74) Attorney, Agent, or Firm—Rabin & Berdo, PC

(57) ABSTRACT

A display module includes a glass substrate, a first lead group, a second lead group, and a plurality of first dummy leads. The first lead group and the second lead group are disposed on a marginal area of the glass substrate. There is a flexible printed circuit (FPC) disposed on the first lead group and the second lead group after a first anisotropic conductive film (ACF) is applied thereon. The first dummy leads are disposed between the first lead group and the second lead group and also on the marginal area of the glass substrate. The first lead group and the second lead group are covered with the first ACF, and the first dummy leads are also covered by the first ACF to improve the performance of adhesion of the first ACF to the glass substrate.

7 Claims, 7 Drawing Sheets

LIQUID CRYSTAL DISPLAY MODULE WITH A FILLED WIRING STRUCTURE HAVING SQUARE SHAPED PADS DISTRIBUTED LIKE A MATRIX

This application claims the benefit of Taiwan application Serial No. 092128771, filed Oct. 16, 2003, the subject matter of which is incorporated herein by reference.

BACKGROUND OF THE INVENTION

1. Field of the Invention

The invention relates in general to a display module, and more particularly to a display module having an anisotropic conductive film (ACF) with improved adhesion performance.

2. Description of the Related Art

Liquid crystal displays (LCDs) are widely applied in various electrical products such as personal digital assistants (PDAs), notebook computers, digital cameras, digital camcorders, mobile telephones, computer monitors, liquid crystal televisions, and the like because the technology for manufacturing the LCDs is rapidly developed and the LCDs have the advantages of being light, thin, power-saving and radiation-free.

A liquid crystal display (LCD) module is assembled by the steps as follow. At first, two glass substrates are provided as a color filter (CF) substrate and a thin-film transistor (TFT) substrate respectively. Then, several driver integrated circuits (ICs) are mounted in a printed circuit board (PCB). The PCB is electrically connected to the TFT substrate after the CF substrate is bonded to the TFT substrate so that the LCD module is completed.

Ways of connecting driver ICs and a TFT substrate include tape auto bonding (TAB), tape carrier package (TCP), and chip-on glass (COG) technology. An anisotropic conductive film (ACF) is applied on several TCP leads of the TFT substrate prior to disposition of the driver ICs on the TCP leads, and then driver ICs are positioned on the TCP leads by heat head tools. So far, driver ICs are bonded with the TFT substrate. Further, TCPs are also bonded with the PCB by heat head tools.

As for COG technology, driver ICs are directly disposed on the TFT substrate and the COG process includes steps of using an ACF to be applied on several COG leads of the TFT substrate and using heat head tools to dispose driver ICs on the COG leads. Besides, the PCB connected with the TFT substrate is bonded with flexible printed circuits (FPCs) so that the TFT substrate is electrically connected with the PCB. An ACF is applied on FPC leads of the TFT substrate, and FPCs are disposed on the FPC leads by heat head tools.

A COG process is illustrated as below. FIG. 1 is a schematic diagram of a conventional LCD module. Referring to FIG. 1, a display module 10 at least has a glass substrate 11, and several driver ICs 12. The driver ICs 12 are disposed on the glass substrate 11 by a technique of chip-on-glass (COG). Before the driver ICs 12 are disposed, there are several COG leads disposed with respect to each of the driver ICs 12 on the glass substrate 11 in advance. Moreover, there are several flexible printed circuit (FPC) leads 13 separately disposed opposite to each of the driver ICs 12 on a marginal area of the glass substrate 11, such as FPC lead groups 13a, 13b, 13c, and 13d. Then, a FPC is further disposed on the FPC lead groups 13a, 13b, 13c, and 13d after a bar of anisotropic conductive film (ACF) is applied thereon.

However, the adhesion performance of an ACF to the glass substrate 11 at a space between two adjacent driver ICs or a space between two adjacent groups of leads, is poorer than areas on which driver ICs or leads are disposed, such as a space 15 between the driver IC 12a and the driver IC 12b, and a space 14 between the FPC lead group 13a and the FPC lead group 13b. Poor adhesion performance of the ACF causes emergence of glue residues on the heat head tools, which consequently influences the following disposition of FPCs. Moreover, TFT substrate is cracked by and the reliability of a total of the display module is deteriorated by such connection failures caused by poor adhesion performance of the ACF to the TFT substrate.

SUMMARY OF THE INVENTION

In view of the foregoing, it is an object of the present invention to provide a display module having dummy leads or a filled wiring structure to improve the adhesion performance of the ACF to the glass substrate.

An object of the present invention is to provide a display module including a glass substrate, a first lead group, a second lead group, and a plurality of first dummy leads. The first lead group and the second lead group are disposed on a marginal area of the glass substrate. There is a flexible printed circuit (FPC) disposed on the first lead group and the second lead group after a first anisotropic conductive film (ACF) is applied thereon. The first dummy leads are disposed between the first lead group and the second lead group and also on the marginal area of the glass substrate. The first ACF covers the first lead group, the second lead group, and the first dummy leads.

Another object of the present invention is to provide a display module including a glass substrate, a first lead group, a second lead group, and a plurality of dummy leads. The first lead group and the second lead group are disposed on a marginal area of the glass substrate. There is a tape carrier package (TCP) disposed on the first lead group and the second lead group after an ACF is applied thereon. The dummy leads are disposed between the first lead group and the second lead group. The ACF covers the first lead group, the second lead group, and the dummy leads.

Still another object of the present invention is to provide a display module including a glass substrate, a first lead group, a second lead group, and a filled wiring structure. The first lead group and the second lead group are disposed on a marginal area of the glass substrate. There is a TCP disposed on the first lead group and the second lead group after an ACF is applied thereon. The filled wiring structure is disposed between the first lead group and the second lead group and on the glass substrate. The ACF covers the first lead group, the second lead group, and the filled wiring structure.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention now will be described more fully hereinafter with reference to the accompanying drawings, in which following six examples of the preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like components throughout.

EXAMPLE 1

Figure 1:
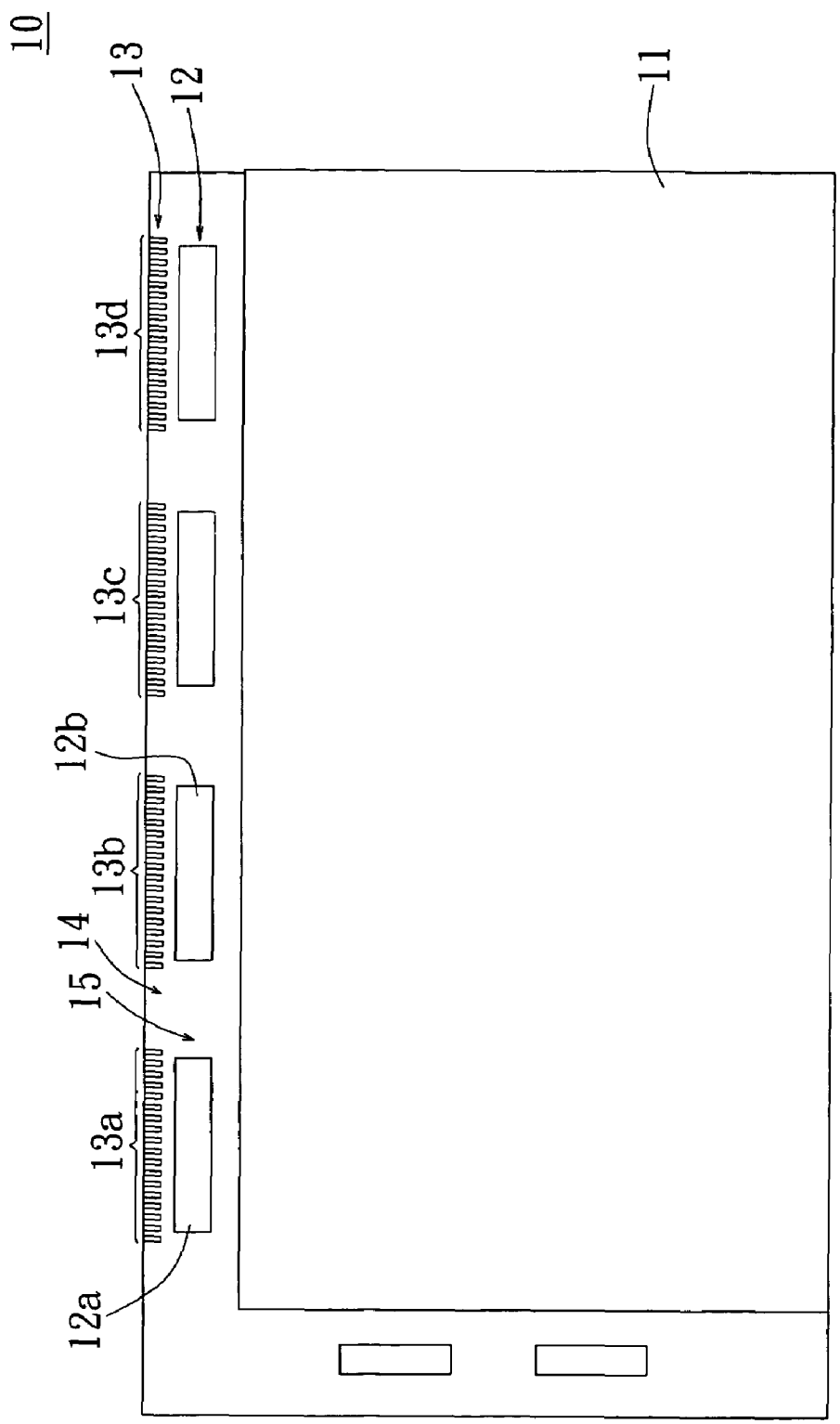
FIG. 1 (Related Art) is a schematic diagram of a conventional LCD module.
Figure 2:
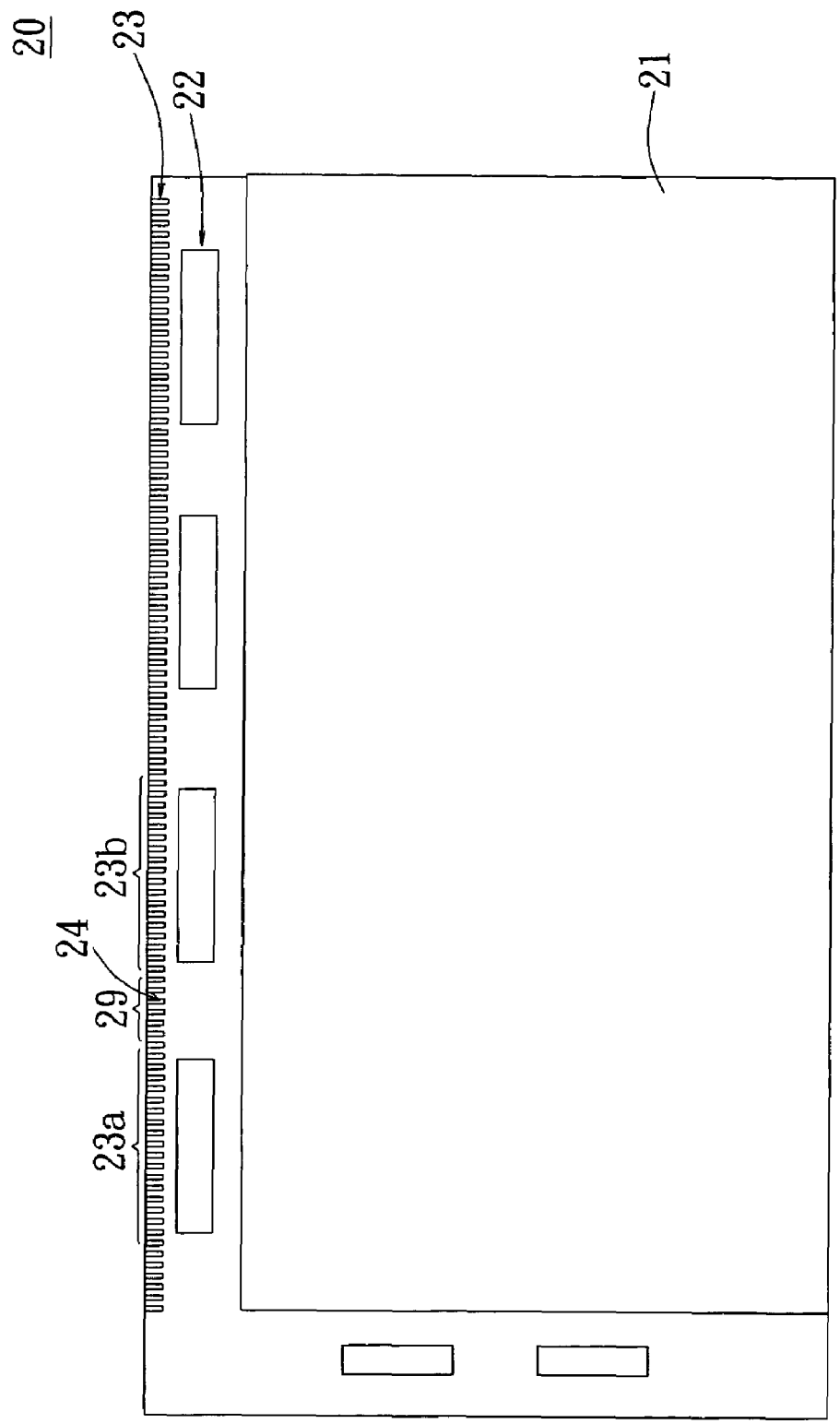
FIG. 2 is a schematic diagram of a LCD module according to the first embodiment of the invention.

FIG. 2 is a schematic diagram of a LCD module according to the first embodiment of the invention. Referring to FIG. 2, a display module 20 at least includes a glass substrate 21, a first lead group 23a, a second lead group 23b, and several dummy structures, such as dummy leads 29. There are several driver ICs 22 disposed on the glass substrate 21 by a technique of chip-on-glass (COG). Moreover, there are several flexible printed circuit (FPC) leads 23 separately disposed opposite to each of the driver ICs 22 on a marginal area of the glass substrate 21, such as the first lead group 23a and the second lead group 23b. A FPC is disposed on the first lead group 23a and the second lead group 23b after a bar of anisotropic conductive film (ACF) is applied thereon.

The dummy leads 29 are disposed between the first lead group 23a and the second lead group 23b and also on the marginal area of the glass substrate 21. That is to say, a space 24 between the first lead group 23a and the second lead group 23b is filled with the dummy leads 29. ACF covers the dummy leads 29, in addition to the first lead group 23a and the second lead group 23b, so that the adhesion between the ACF and the glass substrate 21 is enhanced.

EXAMPLE 2

Figure 3:
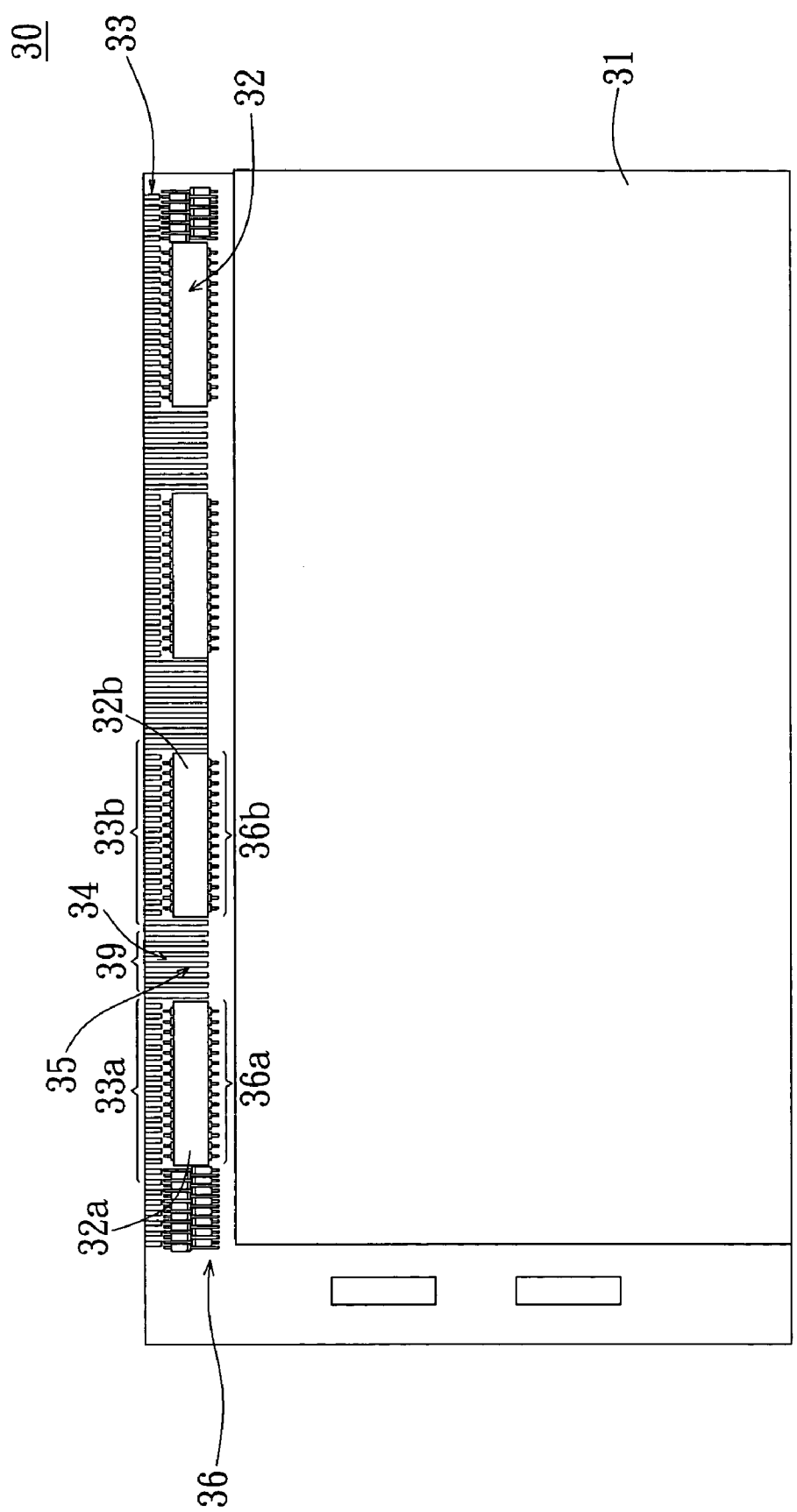
FIG. 3 is a schematic diagram of a LCD module according to the second embodiment of the invention.

FIG. 3 is a schematic diagram of a LCD module according to the second embodiment of the invention. Referring to FIG. 3, a display module 30 at least includes a glass substrate 31, a first lead group 33a, a second lead group 33b, a third lead group 36a, a fourth lead group 36b and several dummy leads 39. There are several driver ICs 32 disposed on the glass substrate 31 by a technique of chip-on-glass, such as a first driver IC 32a and a second driver IC 32b. Before the driver ICs 32 are disposed, there are several groups of COG leads 36 disposed with respect to each of the driver ICs 32 on the glass substrate 31 in advance. For example, the third lead group 36a and the fourth lead group 36b are disposed with respect to the first driver IC 32a and the second drive IC 32b on the glass substrate 31 respectively prior to the disposition of the first driver IC 32a and the second drive IC 32b. The third lead group 36a and the fourth lead group 36b preferably include several COG leads. The first driver IC 32a and the second drive IC 32b are disposed on the third lead group 36a and the fourth lead group 36b after a second anisotropic conductive film (ACF) is applied thereon.

Moreover, there are several groups of FPC leads 33 separately disposed opposite to each of the driver ICs 32 on a marinal area of the glass substate 31, such as the first lead group 33a and the second lead group 33b are disposed opposite to the first driver IC 32a and the second driver IC 32b, respectively. The first lead group 33a and the second lead group 33b preferably include several FPC leads. A circuit apparatus, such as an FPC, is disposed on the first lead group 33a and the second lead group 33b after a first ACF is applied thereon.

The dummy leads 39 are disposed between the first lead group 33a and the second lead group 33b and also on the marginal area of the glass substrate 31. That is to say, a space 34 between the first lead group 33a and the second lead group 33b is filled with the dummy leads 39. The first ACF covers the dummy leads 39, in addition to the first lead group 33a and the second lead group 33b, so that the adhesion between the second ACF to the glass substrate 31 is enhanced.

Besides, the dummy leads 39 are further lengthened so that the dummy leads 39 are disposed between the third lead group 36a and the fourth lead group 36b. That is to say, a space 35 between the third lead group 36a and the fourth lead group 36b is filled with the dummy leads 39. The second ACF covers the dummy leads 39, in addition to the third lead group 36a and the fourth lead group 36b, so that the adhesion between the second ACF to the glass substrate 31 is enhanced.

EXAMPLE 3

Figure 4:
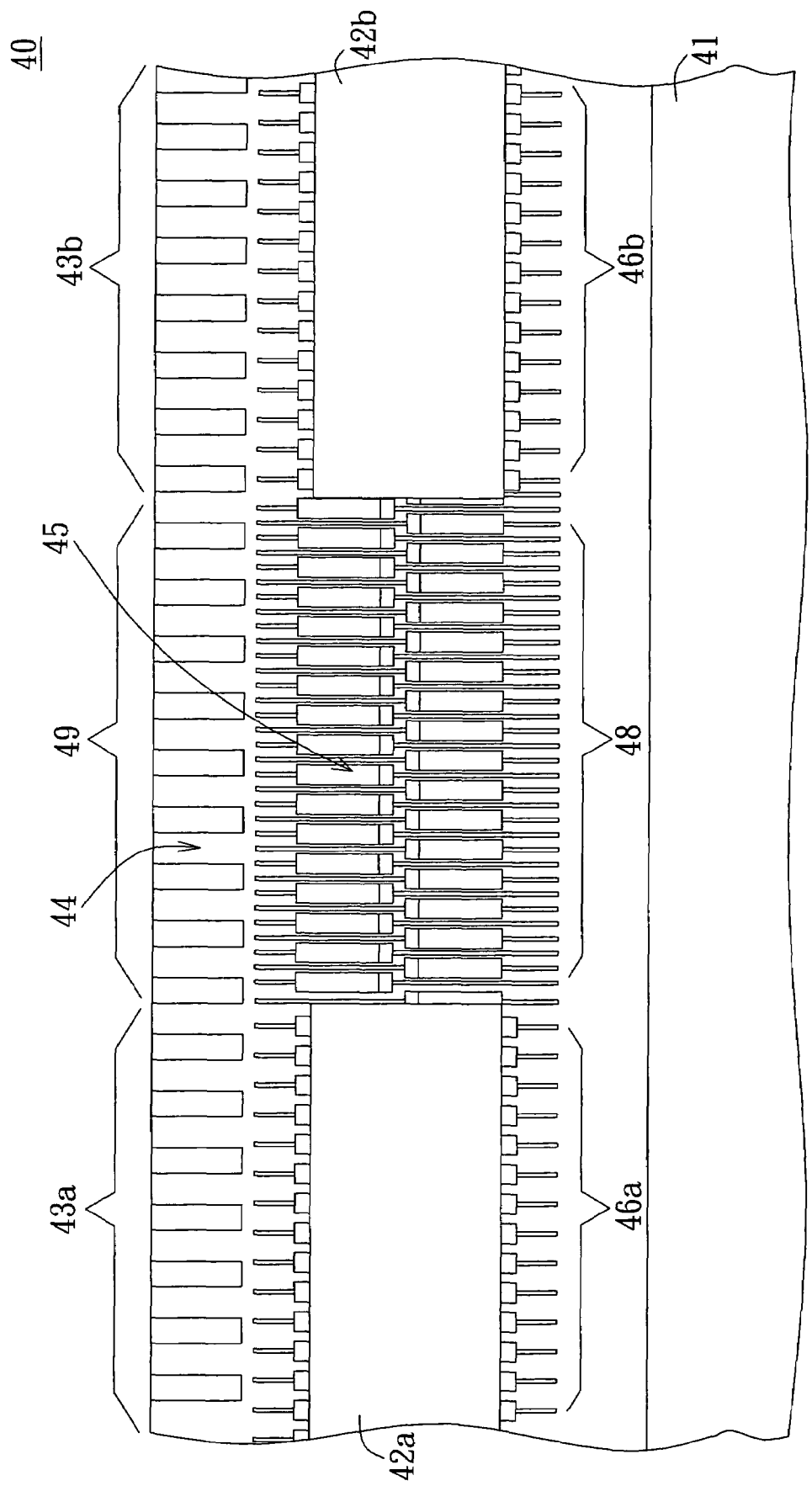
FIG. 4 is a schematic diagram of a LCD module according to the third embodiment of the invention.

FIG. 4 is a schematic diagram of a LCD module according to the third embodiment of the invention. Referring to FIG. 4, a display module 40 at least includes a glass substrate 41, a first lead group 43a, a second lead group 43b, a third lead group 46a, a fourth lead group 46b, several first dummy leads 49 and several second dummy leads 48. There are several driver ICs disposed on the glass substrate 41 by a technique of chip-on-glass, such as a first driver IC 42a and a second driver IC 42b. Before the first driver IC 42a and the second driver IC 42b are disposed, there are several groups of COG leads disposed with respect to each of the driver ICs on the glass substrate 41 in advance. For example, the third lead group 46a and the fourth lead group 46b are disposed with respect to the first driver IC 42a and the second drive IC 42b on the glass substrate 41 respectively. The third lead group 46a and the fourth lead group 46b preferably include several COG leads. The first driver IC 42a and the second drive IC 42b are disposed on the third lead group 46a and the fourth lead group 46b after a second ACF is applied thereon.

Moreover, there are several groups of FPC leads separately disposed opposite to each of the driver IC 42a and the second drive IC 42b on a marginal area of the glass substrate 41, such as the first lead group 43a and the second lead group 43b are disposed opposite to the first driver IC 42a and the second driver IC 42b, respectively. The first lead group 43a and the second lead group 43b preferably include several FPC leads. A FPC is disposed on the first lead group 43a and the second lead group 43b after a first ACF is applied thereon.

The first dummy leads 49 are disposed between the first lead group 43a and the second lead group 43b and also on the marginal area of the glass substrate 41. That is to say, a space 44 between the first lead group 43a and the second lead group 43b is filled with the first dummy leads 49. The first ACF covers the first dummy leads 49, in addition to the first lead group 43a and the second lead group 43b, so that the adhesion between the first ACF to the glass substrate 41 is enhanced.

Besides, the second dummy leads 48 are disposed between the third lead group 46*a* and the fourth lead group 46*b* on the glass substrate 41. That is to say, a space 45 between the third lead group 46*a* and the fourth lead group 46*b* is filled with the second dummy leads 48. The second dummy leads 48 are preferably several COG leads. The second ACF covers the second dummy leads 48, in addition to the third lead group 46*a* and the fourth lead group 46*b*, so that the adhesion between the second ACF to the glass substrate 41 is enhanced.

EXAMPLE 4

Figure 5A:
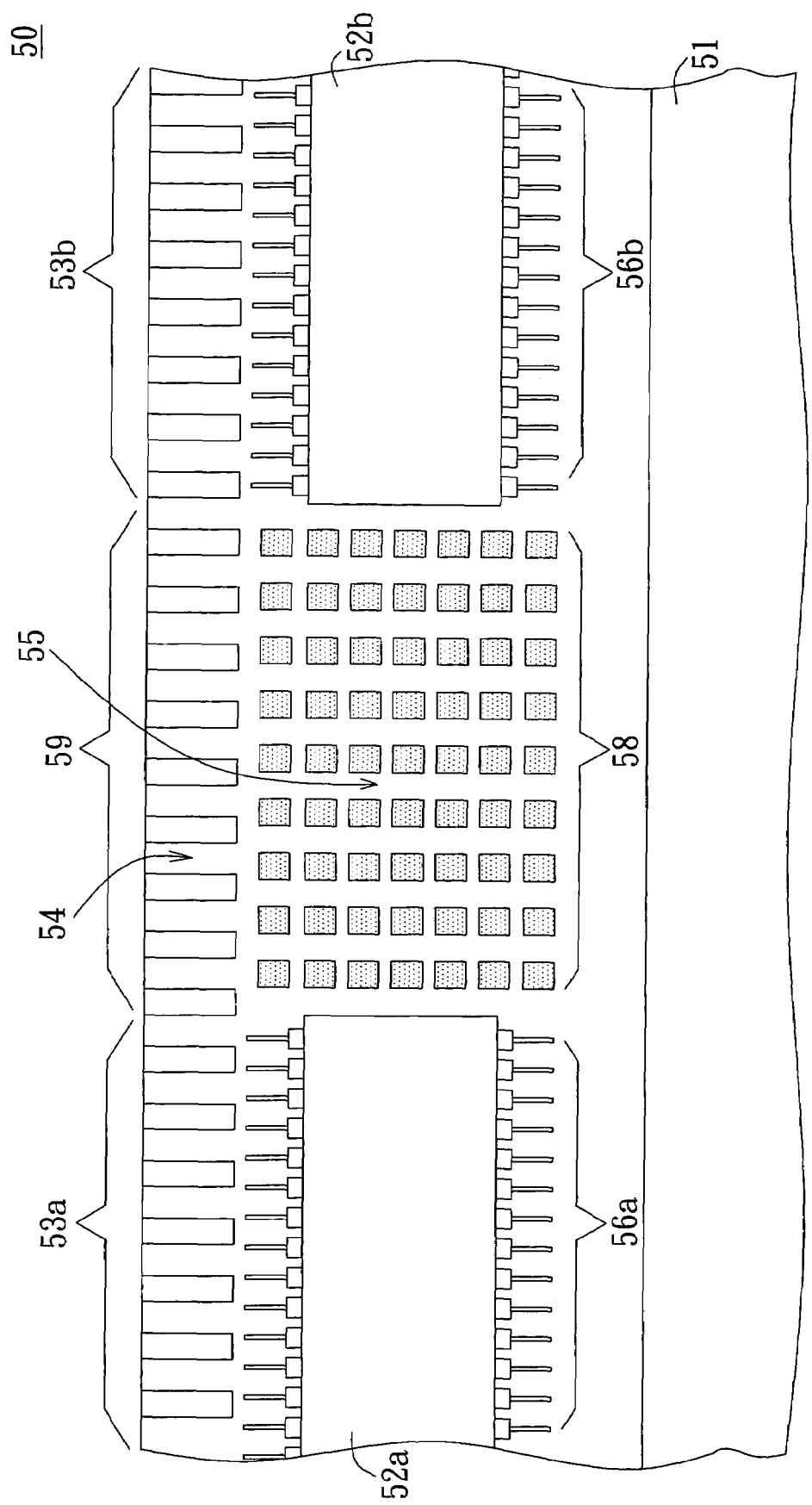
FIG. 5A is a schematic diagram of a LCD module according to the fourth embodiment of the invention.

FIG. 5A is a schematic diagram of a LCD module according to the fourth embodiment of the invention. Referring to FIG. 5A, a display module 50 at least includes a glass substrate 51, a first lead group 53*a*, a second lead group 53*b*, a third lead group 56*a*, a fourth lead group 56*b*, several dummy leads 59 and a filled wiring structure 58. There are several driver ICs disposed on the glass substrate 51 by a technique of chip-on-glass, such as a first driver IC 52*a* and a second driver IC 52*b*. Before the first driver IC 52*a* and the second driver IC 52*b* are disposed, there are several groups of COG leads disposed with respect to each of the driver ICs on the glass substrate 51 in advance. For example, the third lead group 56*a* and the fourth lead group 56*b* are disposed with respect to the first driver IC 52*a* and the second drive IC 52*b* on the glass substrate 51 respectively. The third lead group 56*a* and the fourth lead group 56*b* preferably include several COG leads. The first driver IC 52*a* and the second drive IC 52*b* are disposed on the third lead group 56*a* and the fourth lead group 56*b* after a second ACF is applied thereon.

Moreover, there are several groups of FPC leads separately disposed opposite to the first driver IC 52*a* and the second drive IC 52*b* on a marginal area of the glass substrate 51, such as the first lead group 53*a* and the second lead group 53*b* are disposed opposite to the first driver IC 52*a* and the second driver IC 52*b*, respectively. The first lead group 53*a* and the second lead group 53*b* preferably include several FPC leads. A FPC is disposed on the first lead group 53*a* and the second lead group 53*b* after a first ACF is applied thereon.

The dummy leads 59 are disposed between the first lead group 53*a* and the second lead group 53*b* and also on the marginal area of the glass substrate 51. That is to say, a space 54 between the first lead group 53*a* and the second lead group 53*b* is filled with the dummy leads 59. The first ACF covers the dummy leads 59, in addition to the first lead group 53*a* and the second lead group 53*b*, so that the adhesion between the first ACF to the glass substrate 51 is enhanced.

Besides, the filled wiring structure 58 are disposed between the third lead group 56*a* and the fourth lead group 56*b* on the glass substrate 51. That is to say, a space 55 between the third lead group 56*a* and the fourth lead group 56*b* is filled with the filled wiring structure 58. The second ACF covers the filled wiring structure 58, in addition to the third lead group 56*a* and the fourth lead group 56*b*, so that the adhesion between the second ACF to the glass substrate 51 is enhanced.

Figure 5D:
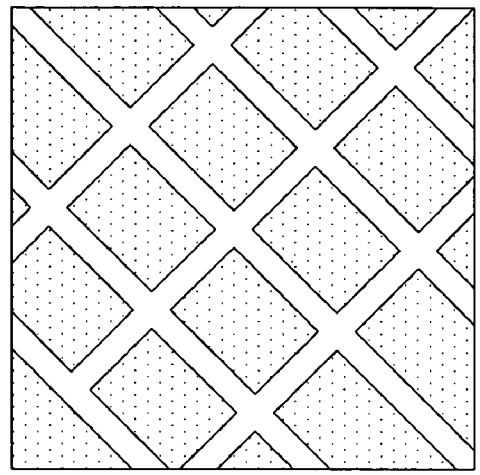
FIG. 5D is a schematic diagram showing the fourth example of the filled wiring structure 58 in FIG. 5A.
Figure 5C:
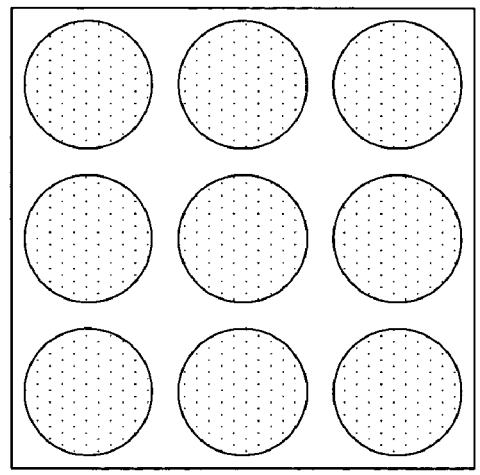
FIG. 5C is a schematic diagram showing the third example of the filled wiring structure 58 in FIG. 5A.
Figure 5B:
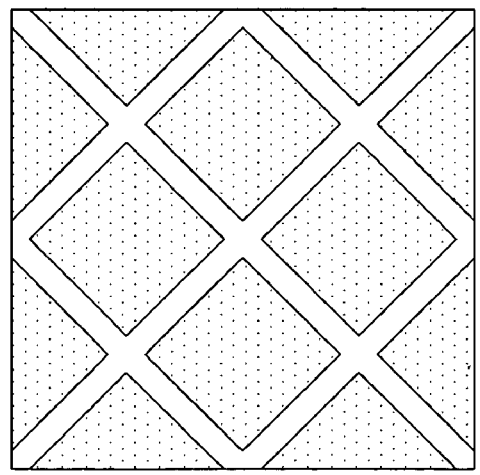
FIG. 5B is a schematic diagram showing the second example of the filled wiring structure 58 in FIG. 5A.

The filled wiring structure 58 is preferably made of several pads. The pads are square-shaped and are distributed like a matrix, as shown in FIG. 5A. However, the shapes of the pads and the distribution way are not limited in what are described above. It will be understood to one skilled in the art that various shapes of the pads can be applied to form the filled wiring structure 58. Referring to FIG. 5B, FIG. 5C, and FIG. 5D, the pads can be rhombus-shaped and be distributed like a matrix, as shown in FIG. 5B which is a schematic diagram showing the second example of the filled wiring structure 58 in FIG. 5A. Or, the pads can be circle-shaped and be distributed like a matrix, as shown in FIG. 5C which is a schematic diagram showing the third example of the filled wiring structure 58 in FIG. 5A. Or, the pads can be oblique rectangle-shaped and be distributed compactly, as shown in FIG. 5D which is a schematic diagram showing the fourth example of the filled wiring structure 58 in FIG. 5A.

EXAMPLE 5

Figure 6:
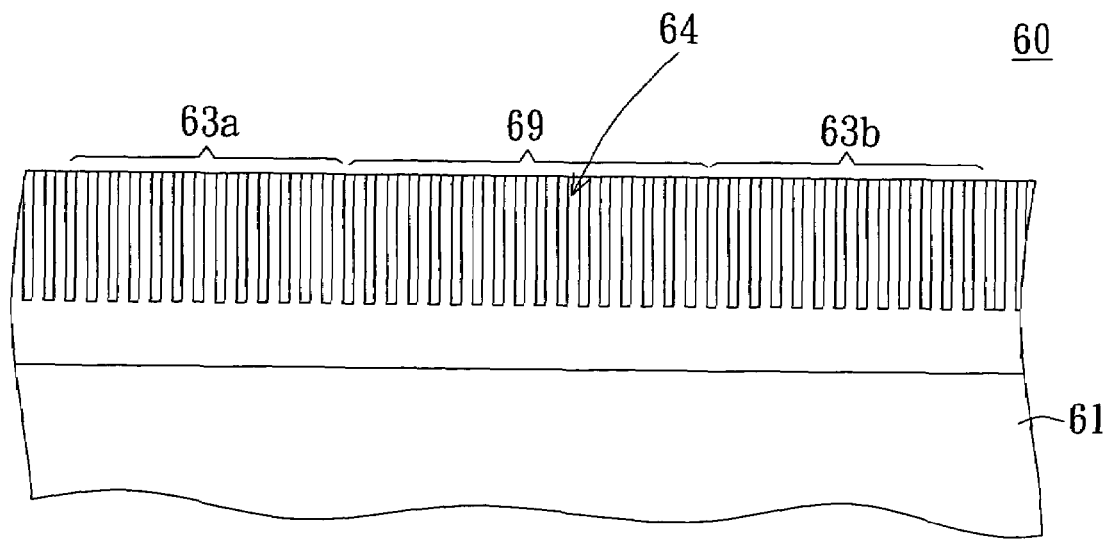
FIG. 6 is a schematic diagram of a LCD module according to the fifth embodiment of the invention.

FIG. 6 is a schematic diagram of a LCD module according to the fifth embodiment of the invention. Referring to FIG. 6, a display module 60 at least includes a glass substrate 61, a first lead group 63*a*, a second lead group 63*b*, and several dummy leads 69. The first lead group 63*a* and the second lead group 63*b* are disposed on a marginal area of the glass substrate 61. The first lead group 63*a* and the second lead group 63*b* preferably include several tape carrier package (TCP) leads. A TCP is disposed on the first lead group 63*a* and the second lead group 63*b* after an ACF is applied thereon.

The dummy leads 69 are disposed between the first lead group 63*a* and the second lead group 63*b* also on the marginal area of the glass substrate 61. That is to say, a space 64 between the first lead group 63*a* and the second lead group 63*b* is filled with the dummy leads 69. The ACF covers the dummy leads 69, in addition to the first lead group 63*a* and the second lead group 63*b*, so that the adhesion between the ACF to the glass substrate 61 is enhanced.

EXAMPLE 6

Figure 7:
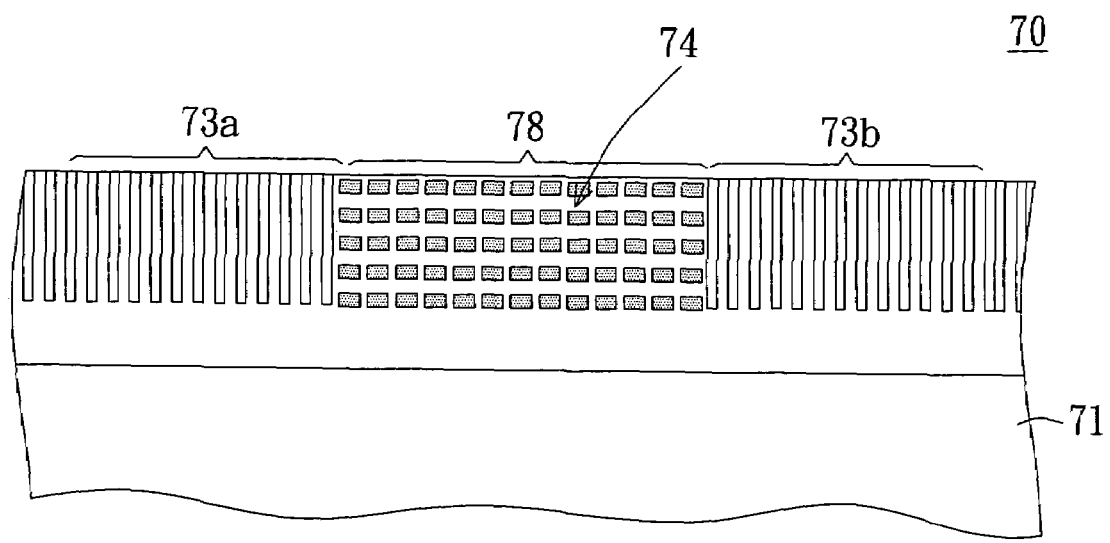
FIG. 7 is a schematic diagram of a LCD module according to the sixth embodiment of the invention.

FIG. 7 is a schematic diagram of a LCD module according to the sixth embodiment of the invention. Referring to FIG. 7, a display module 70 at least includes a glass substrate 71, a first lead group 73*a*, a second lead group 73*b*, and a filled wiring structure 78. The first lead group 73*a* and the second lead group 73*b* are disposed on a marginal area of the glass substrate 71. The first lead group 73*a* and the second lead group 73*b* preferably include several tape carrier package (TCP) leads. A TCP is disposed on the first lead group 73*a* and the second lead group 73*b* after an ACF is applied thereon.

The filled wiring structure 78 is disposed between the first lead group 73*a* and the second lead group 73*b* also on the marginal area of the glass substrate 71. That is to say, a space 74 between the first lead group 73*a* and the second lead group 73*b* is filled with the filled wiring structure 78. The ACF covers the filled wiring structure 78, in addition to the first lead group 73*a* and the second lead group 73*b*, so that the adhesion between the ACF to the glass substrate 71 is enhanced.

Analogously, the filled wiring structure 78 is similar to the filled wiring structure 58 disclosed in the fourth example of the present invention. The filled wiring structure 78 is made of several pads and the pads are square-shaped and are distributed like a matrix, as shown in FIG. 7. The pads can be rhombus-shaped and be distributed like a matrix, as shown in FIG. 5B; the pads can be circle-shaped and be distributed like a matrix, as shown in FIG. 5C, or the pads can be oblique rectangle-shaped and be distributed compactly, as shown in FIG. 5D.

The display modules disclosed above can improve the adhesion performance of ACFs to the glass substrate by using several dummy leads or a filled wiring structure thereon. Accordingly, in the case of TFT substrates having such dummy leads or filled wiring structure, the reliability of a total of the display module can significantly be promoted.

However, the present inventions are not limited in what are described above. For example, each of the display modules 10, 20, 30, 40, 50, 60, and 70 is a liquid crystal display (LCD) module; each of the glass substrates 11, 21, 31, 41, 51, 61, and 71 is a thin-film transistor (TFT) glass substrate. Also, it will be understood that the spirit of the present invention can be applied to any manufacturing processes concerning ACFs, such as tape carrier package (TCP) process, chip-on-film (COF) process, chip-on-glass (COG) process, or flexible printed circuit (FPC) process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display module, comprising:
   a glass substrate;
   a first lead group and a second lead group, disposed on a marginal area of the glass substrate, wherein there is a flexible printed circuit (FPC) disposed on the first lead group and the second lead group after a first anisotropic conductive film (ACF) is applied thereon;
   a plurality of first dummy leads, disposed between the first lead group and the second lead group and also on the marginal area of the glass substrate, wherein the first ACF covers the first lead group, the second lead group, and the first dummy leads;
   a third lead group and a fourth lead group, disposed on the marginal area of the glass substrate on the glass substrate and located opposite to the first lead group and the second lead group, respectively;
   a first driver IC and a second driver IC, respectively disposed on the third lead group and the fourth lead group after a second ACF is applied thereon; and
   a filled wiring structure comprising a plurality of pads disposed between the third lead group and the fourth lead group and on the glass substrate, the second ACF covering the third lead group, the fourth lead group, and the filled wiring structure, wherein the pads are square-shaped and are distributed like a matrix.

2. The display module according to claim 1, wherein the display module is a liquid crystal display (LCD) module, the glass substrate is a thin-film transistor (TFT) glass substrate, the first lead group and the second lead group comprise a plurality of FPC leads, and the third lead group and the fourth lead group comprise a plurality of chip-on-glass (COG) leads.

3. A display module, comprising:
   a glass substrate;
   a first lead group and a second lead group, disposed on a marginal area of the glass substrate, wherein there is a TCP disposed on the first lead group and the second lead group after an ACF is applied thereon; and
   a filled wiring structure comprising a plurality of pads, disposed between the first lead group and the second lead group and on the glass substrate, and electrically isolated from the first and second lead groups, the ACF covering the first lead group, the second lead group, and the filled wiring structure, wherein the pads are square-shaped and are distributed like a matrix.

4. A display module, comprising:
   a glass substrate;
   a first lead group and a second lead group, disposed on a marginal area of the glass substrate, wherein there is a circuit apparatus comprising a tape carrier package (TCP) disposed on the first lead group and the second lead group after a first anisotropic conductive film (ACF) is applied thereon; and
   a first dummy structure comprising a filled wiring structure, disposed between the first lead group and the second lead group and also on the marginal area of the glass substrate;
   wherein the first ACF covers the first lead group, the second lead group and first dummy structure;
   wherein the filled wiring structure comprises a plurality of pads, and the pads are square-shaped and are distributed like a matrix.

5. The display module according to claim 4, wherein the display module is a LCD module, and the glass substrate is a TFT glass substrate.

6. A display module, comprising:
   a glass substrate;
   a first lead group and a second lead group, disposed on a marginal area of the glass substrate, wherein there is a circuit apparatus comprising a flexible printed circuit (FPC) disposed on the first lead group and the second lead group after a first anisotropic conductive film (ACF) is applied thereon;
   a first dummy structure comprising a plurality of dummy leads, disposed between the first lead group and the second lead group and also on the marginal area of the glass substrate, wherein the first ACF covers the first lead group, the second lead group and first dummy structure to increase adherence to the glass substrate;
   a third lead group and a fourth lead group, disposed on the marginal area of the glass substrate on the glass substrate and located opposite to the first lead group and the second lead group, respectively;
   a first driver IC and a second driver IC, respectively disposed on the third lead group and the fourth lead group after a second ACF is applied thereon; and
   a second dummy structure comprising a filled wiring structure, disposed between the third lead group and the fourth lead group, wherein the second ACF covers the third lead group, the fourth lead group, and the second dummy structure;
   wherein the filled wiring structure comprises a plurality of pads, and the pads are square-shaped and are distributed like a matrix.

7. The display module according to claim 6, wherein the first lead group and the second lead group comprise a plurality of FPC leads, and the third lead group and the fourth lead group comprise a plurality of chip-on-glass (COG) leads.

* * * * *